United States Patent [19]

Silvian

[11] Patent Number: 4,980,898
[45] Date of Patent: Dec. 25, 1990

[54] SELF-OSCILLATING BURST MODE TRANSMITTER WITH INTEGRAL NUMBER OF PERIODS

[75] Inventor: Sergiu Silvian, La Crescenta, Calif.

[73] Assignee: Siemens-Pacesetter, Inc., Sylmar, Calif.

[21] Appl. No.: 391,077

[22] Filed: Aug. 8, 1989

[51] Int. Cl.$^5$ .......................... H03J 1/00; H04B 1/38
[52] U.S. Cl. ........................................ 375/59; 375/71; 331/165; 128/422; 178/71 M
[58] Field of Search ................ 375/3, 4, 59, 68, 71; 331/165, 166; 178/70 TS, 71 M; 128/419 P, 419 PG, 422

[56] References Cited

U.S. PATENT DOCUMENTS

| | | | |
|---|---|---|---|
| 2,812,437 | 11/1957 | Sziklai | 331/165 |
| 3,082,377 | 3/1963 | Filipowsky | 331/166 |
| 3,329,774 | 7/1967 | Bradmiller | 375/59 |
| 3,458,731 | 7/1969 | Michon et al. | 331/166 |
| 4,043,347 | 8/1977 | Renirie | 128/419 PG |
| 4,283,790 | 8/1981 | Clock et al. | 375/71 |
| 4,446,427 | 5/1984 | Lovrenick | 331/165 |
| 4,700,357 | 10/1987 | Ast | 375/4 |
| 4,881,243 | 11/1989 | Whitt | 375/4 |

*Primary Examiner*—Benedict V. Safourek
*Assistant Examiner*—Young Tse

*Attorney, Agent, or Firm*—Bryant R. Gold; Leslie S. Miller; Malcolm J. Romano

[57] ABSTRACT

A self-oscillating burst mode transmitter transmits an integral number of cycles of a carrier signal in each transmission burst. Each burst commences at a peak value of the carrier signal and terminates at a peak value. The transmitter includes an L-C tank circuit comprising a transmitting coil (L1) connected to a capacitor (C4). The L-C tank circuit is selectively energized through a switching network (Q1, Q2, U1, U2) connected to a power source, causing the tank circuit to resonate at a prescribed frequency ($f_0$). Selective energization of the tank circuit is achieved by the switching network as controlled by a peak voltage detection circuit (32, 34). The peak detection circuit senses when a peak voltage is present in the oscillatory waveform appearing across the coil of the resonating tank circuit. Power is switched off to the tank circuit at the conclusion of each transmission burst only when the oscillatory voltage waveform, as sensed by the peak detection circuit, is at a peak. This peak voltage is stored by the capacitor of the tank circuit during the time the power source is not connected to the tank circuit. At the beginning of the next transmission burst, when power is again coupled to the tank circuit through the switching network, the voltage initially appearing across the coil, and hence the voltage at the commencement of the next oscillatory waveform of the transmission burst, begins at the peak voltage value stored on the capacitor.

20 Claims, 2 Drawing Sheets

SELF-OSCILLATING BURST MODE TRANSMITTER WITH INTEGRAL NUMBER OF PERIODS

BACKGROUND OF THE INVENTION

The present invention relates to an efficient self-oscillating burst mode transmitter or oscillator used with implantable devices, such as medical devices. More particularly, the present invention relates to a self-oscillating burst mode transmitter or oscillator wherein each burst of the transmitted or generated output signal contains an integral number of periods of a carrier signal at a substantially constant amplitude. The invention finds primary application in communicating with an implantable medical device, such as a pacemaker.

Burst mode transmitters or oscillators transmit or generate a carrier signal for a short period of time, termed the "burst" time, and do not transmit or generate the carrier signal in between burst times, or "bursts." Such transmitters or oscillators are commonly used in communication channels, e.g., where digital data is transferred using an ON-OFF keyed encoding scheme. In accordance with an ON-OFF keyed transmission, the presence of a carrier signal indicates one binary value, such as a binary "1", and the absence of the carrier signal indicates the other binary value, such as a binary "0". Thus, a burst mode transmitter may be used to transmit one binary value through the transmission of a burst, and to transmit the other binary value through the absence of a burst.

In general, burst mode transmitters or oscillators may be classified as: (1) self-oscillating, in which case the carrier signal is generated by the transmitter or oscillator upon application of power thereto; or (2) clock-driven, in which case an external clock signal provides the basic signal from which the carrier signal is derived. In general, the self-oscillating type of transmitter or oscillator may operate in two modes. A first mode is a continuous mode, in which case the carrier signal is generated continuously (100% duty cycle), with a burst of the carrier signal being obtained by gating the carrier signal for the desired burst time, and blocking it in between burst times. This gated signal is then applied to a transmitting coil (or other load). A second mode is a burst mode, in which case the carrier signal is generated only during the desired burst time period (less than 100% duty cycle), and is not generated during non-burst time periods. Clock-driven oscillators, as defined above, always operate in the continuous mode because the basic clock signal is always present at a 100% duty cycle.

Continuous mode operation of a burst mode transmitter or oscillator is inefficient. That is, a significant amount of power may be consumed during the non-burst periods when operation of the transmitter or oscillator is not needed. The ideal burst mode transmitter or oscillator, from a power efficient stand point, is ON only when transmitting or generating a burst of the carrier signal, and OFF at all other times.

Unfortunately, even when operating in a burst mode, a self-oscillating burst mode transmitter is generally not able to operate at maximum efficiency. This is because the carrier signal must typically be applied to an inductive load (transmitting coil or antenna), and the transient response associated with suddenly applying a signal to an inductive load prevents the applied carrier signal from assuming its maximum value (amplitude) across the inductive load throughout the entire duration of the transmitted burst. Hence, a portion of each burst, typically more than one cycle of the carrier signal, must usually be transmitted at less than maximum power. While this effect can be minimized by increasing the duration of the burst, such increase of burst time may significantly slow down the rate at which data can be transferred (the burst rate). Further, while this effect can also be minimized in some instances by increasing the frequency of the carrier signal, and thereby increasing the number of cycles of the carrier signal within each burst, it is often undesirable or not possible to increase the carrier signal frequency due to the bandwidth limitations of the available communications channel. What is needed, therefore, is a self-oscillating burst mode transmitter that provides for the efficient transmission of a carrier signal throughout the entire duration of the transmitted burst.

It is known in the art to use a tank circuit in a self-oscillating burst mode oscillator or transmitter for the purpose of generating the carrier frequency. The tank circuit consists of an inductor and a capacitor connected in a suitable series or parallel circuit configuration. When the tank circuit is energized with power of an appropriate polarity, the tank circuit begins to resonate at its resonant frequency. (The resonant frequency of a tank circuit is a function of the inductor and capacitor values used therein.) If power of an appropriate polarity is periodically applied to the tank circuit, the oscillations at the resonant frequency continue. Unfortunately, it typically takes several cycles of the resonating carrier signal before a steady-state oscillatory condition exists within the tank circuit. Much of the energy pumped into the tank circuit in order to achieve this steady-state condition is lost if the tank circuit is suddenly started, as occurs at the beginning of a transmitted burst, or if the tank circuit is suddenly shut down, as occurs at the end of a transmitted burst. Thus, more efficient operation of the transmitter or oscillator circuit could be achieved if the energy in the tank circuit at the conclusion of a burst could be saved and used at the beginning of the next burst.

Further, when operating a transmitter in a burst mode, it may be desirable to control the exact number of cycles of the carrier signal that occur during each transmitted burst. Heretofore, the number of cycles appearing in a given burst has been only approximately determined by controlling the duration of the transmitted burst from an external time base. What is needed is a more precise technique for controlling the number of cycles of the carrier signal appearing in each burst, and more particularly a technique that accurately places a programmable integral number of cycles of the carrier signal in each burst.

The present invention advantageously addresses the above and other needs.

SUMMARY OF THE INVENTION

The present invention is directed to a self-oscillating burst mode transmitter that transmits an integral number of carrier signal cycles in each transmission burst. Advantageously, after an initial burst, each transmitted burst commences at a peak voltage value of the carrier signal and terminates at a peak voltage value, with this peak voltage value being stored in the tank circuit in between bursts. Storing of the peak voltage value advantageously avoids transient problems associated with switched inductive loads, thereby allowing the burst to always be transmitted efficiently at full power.

The transmitter includes an L-C tank circuit comprising a transmitting coil connected to a capacitor. The L-C tank circuit is selectively energized through a switching network connected to a power source. When switchably energized, the tank circuit resonates at a prescribed frequency. Selective energization of the tank circuit through the switching network is controlled by a peak voltage detection circuit. The peak detection circuit senses when a peak voltage is present in the oscillatory waveform appearing across the coil of the resonating tank circuit, and when the polarity of the power connected to the tank circuit should be reversed.

At the conclusion of each transmission burst, the switching network removes (switches off) power from the tank circuit, i.e., does not allow power of either polarity to be connected to the tank circuit. However, this switching off of the power occurs only when the oscillatory voltage waveform, as sensed by the peak detection circuit, is at a maximum value, or peak. (This maximum value may be either positive or negative.) At this turn-off time, the peak voltage is stored by the capacitor of the tank circuit, which capacitor maintains (stores) this peak voltage during the time the power source is not connected to the tank circuit. At the beginning of the next transmission burst, when power is again coupled to the tank circuit through the switching network, the voltage initially appearing across the coil, and hence the voltage at the commencement of the next oscillatory waveform of the transmission burst, begins at the peak voltage value stored on the capacitor. In this manner, the transmitted burst begins at a peak voltage and ends at a peak voltage, with an integral number of cycles occurring in the burst.

In one embodiment of the present invention, the peak detection circuit is realized using a phase shift network and a zero crossing detector. The phase shift network shifts the phase of the voltage waveform developed across the coil of the tank circuit by 90 degrees. Advantageously, the zero crossings of this phase shifted signal, which are easily detected in a comparator circuit, then mark the peaks of the coil voltage. The occurrence of such peaks in the coil voltage are then used in appropriate logic circuits for controlling the switching network that connects and disconnects the power source to the tank circuit. For example, only at the occurrence of a peak coil voltage as above described is the polarity of the power connected to the tank circuit via the switching network reversed, thereby assuring maximum energy transfer to the tank circuit. Similarly, only at the occurrence of a peak coil voltage is power disconnected from the tank circuit via the switching network at the conclusion of the transmitted burst, thereby assuring that an integral number of cycles of the coil voltage have occurred in the transmitted burst. Further, such action allows the power existing in the tank circuit at the time the power is disconnected from the tank circuit to be efficiently stored on the capacitor, which stored power is then made available at the beginning of the next burst.

The present invention may thus be characterized, in accordance with one variation thereof, as a self-oscillating burst mode transmitter that comprises: (1) an L-C tank circuit that includes a transmitting coil connected to a capacitor; (2) switch means responsive to a control signal for switchably connecting an energy source to the L-C tank circuit, causing the L-C tank circuit to oscillate at a resonant frequency, an oscillatory voltage waveform being developed across the transmitting coil and capacitor as the tank circuit oscillates; (3) phase shift means coupled to the transmitting coil for generating an output voltage signal having the same frequency as the oscillatory voltage waveform, this output voltage signal having a phase angle that is shifted from the phase angle of the oscillatory voltage waveform by a prescribed amount; (4) comparator means for comparing the amplitude of the output voltage signal generated by the phase shift means with a reference signal, and for generating the control signal as a function of whether the amplitude of the output voltage signal is less than or greater than the reference signal; and (5) inhibiting means for selectively blocking the delivery of the control signal to the switch means at a time within a cycle of the oscillatory voltage waveform when the voltage appearing across the transmitting coil and capacitor is at a peak voltage value, the capacitor of the L-C tank circuit storing the peak voltage value until such time as the control signal is no longer inhibited. In operation, then, the tank circuit starts its next oscillatory cycle (when not inhibited by the inhibiting means) with the voltage waveform across the transmitter coil being at the stored peak voltage value; and stops its oscillatory cycle with the voltage waveform across the transmitter coil being at a corresponding peak voltage value. In this way, an integral number of periods of the oscillating voltage waveform occur between the time the oscillatory cycle starts and stops.

In a somewhat broader sense, the present invention may be characterized as a burst mode integer period oscillator that includes: (1) a tank circuit including a coil connected to a capacitor; (2) switch means for delivering power to the tank circuit, the tank circuit oscillating at a resonant frequency in response to the delivered power, thereby causing an oscillatory voltage waveform to be developed across the coil and compacitor as the tank circuit oscillates; (3) sensing means for sensing when the oscillatory voltage waveform is at a peak value; and (4) inhibiting means synchronized with the sensing means for selectively stopping the delivery of the power to the tank circuit at a time when the oscillatory voltage waveform developed across the coil and capacitor is at a peak voltage value. In operation, the capacitor of the tank circuit stores the peak voltage value until the inhibiting means allows power to be delivered to the tank circuit, at which time the tank circuit again begins to oscillate at the resonant frequency, with the oscillatory voltage waveform beginning at the peak voltage value stored by the capacitor. In this manner, the tank circuit starts an oscillatory cycle (when allowed by the inhibiting means) at a time when the voltage waveform across the transmitter coil is at a first peak value. Further, the tank circuit stops the oscillatory cycle (as controlled by the inhibiting means) at a time when the voltage waveform across the transmitter coil is at a second peak value. An integral number of periods of the oscillating voltage waveform occur between the first and second peak values, and are thus included within the signal burst of the oscillator.

Further, the invention includes a method of controlling a burst mode oscillator so that each burst contains an integral number of cycles. The oscillator used with this method includes a tank circuit that generates an oscillatory waveform having a prescribed frequency upon being energized with power from an external power source. The method includes the steps of: (a)

energizing the tank circuit with power whenever a first burst of oscillations is desired; (b) sensing when the oscillatory waveform associated with the energized tank circuit is at a prescribed value; (c) selectively inhibiting the delivery of power to the tank circuit at the conclusion of the first burst of oscillations at a point within a cycle of the oscillatory waveform when the waveform sensed in step (b) is at a prescribed value; (d) storing the energy associated with the prescribed value of the oscillatory waveform during the time when the tank circuit is inhibited; and (e) starting the oscillatory waveform of the tank circuit, when next energized at the beginning of a second burst of oscillations, at the prescribed value stored within the tank circuit in step (d).

It is an aspect of the present invention to provide a self-oscillating burst mode transmitter or oscillator that periodically transmits or generates bursts of a carrier signal at a prescribed rate, such as one burst every T seconds, and wherein each burst includes an integral number of periods of the carrier signal.

It is a further aspect of the invention to provide such a transmitter or oscillator wherein the carrier signal starts and stops each burst at a peak value.

It is yet another aspect of the invention to provide a transmitter or oscillator as described above wherein the peak voltage of the carrier signal at the conclusion of a given burst is stored and used as the starting voltage of the carrier signal at the commencement of the next burst.

It is still another aspect of the invention to provide a transmitter or oscillator as described above that is low in cost, efficient to operate, and reliable in performance.

A still further aspect of the invention provides an efficient burst mode transmitter or oscillator that periodically transmits or generates bursts of a carrier signal by selectively energizing a tank circuit, the resonant frequency of the tank circuit comprising the frequency of the carrier signal present in each burst. Significantly, in accordance with this aspect of the invention, the tank circuit is not energized in between bursts, thereby conserving power. Nonetheless, once the tank circuit is energized, the carrier signal is immediately available at full power throughout the duration of the burst without significant transient effects and/or needless power consumption.

Still another aspect of the invention provides such a burst mode transmitter or oscillator wherein an integral number of cycles of the carrier signal in each burst may be programmably selected.

Another aspect of the invention provides a method of generating or transmitting an integral number of cycles of a carrier signal within each burst of a burst mode oscillator or transmitter. In accordance with this aspect of the invention, the peaks (or other prescribed points) of the carrier signal are detected, and are used to precisely control when a tank circuit, resonant at the carrier signal frequency, is connected or disconnected to a suitable power source. When connected to the power source, the tank circuit resonates for an integral number of cycles, thereby providing an integral number of carrier signal cycles. When disconnected from the power source, the tank circuit does not resonate, and no carrier signal is provided.

Yet a further aspect of the invention is to provide an efficient self-oscillating burst mode transmitter and/or method of transmitting as above described wherein the transmitter and/or method are especially adapted for transmitting burst signals containing an integral number of carrier frequency cycles to or from an implanted device, such as an implanted medical device, e.g., a pacemaker.

BRIEF DESCRIPTION OF THE DRAWINGS

The above and other aspects, advantages and features of the present invention will be more apparent from the following more particular description thereof, presented in conjunction with the following drawings, wherein:

FIG. 5 is a waveform timing diagram that illustrates the key waveforms associated with the operation of the self oscillating burst mode transmitter of FIG. 4.

DETAILED DESCRIPTION OF THE INVENTION

The following description is of the best mode presently contemplated for practicing the present invention. This description is not to be taken in a limiting sense but is made merely for the purpose of describing the general principles of the invention.

Figure 1:
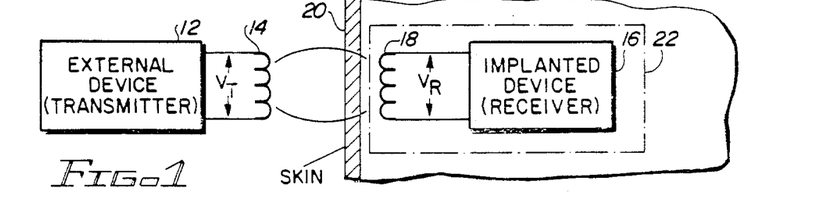
FIG. 1 is a block diagram illustrating the use of a burst mode/transmitter for transmitting signal bursts to an implanted device.

Referring to FIG. a preferred manner of using the present invention is shown. An external device 12 includes a transmitter that transmits a signal from a transmitting coil 14 to an implantable device 16, such as an implantable pacemaker. The device 16 is implanted beneath a layer of skin 20 of the person or animal in which the device is used. A receiving coil 18 is coupled to a receiver circuit included within the device 16. Both the receiver circuit 16 and the receiving coil 18 are placed within an sealed enclosure 22, typically made from stainless steel or some other body compatible substance.

In operation, the transmitting coil 14 is positioned as close as possible to the receiving coil 18, e.g., within a few inches, and the two coils are inductively coupled to each other. As such, a voltage signal $V_T$ appearing across the transmitting coil 14 is induced in the receiving coil 18, where it appears as a voltage signal $V_R$. The two coils thus function much the same as an air coil transformer, with the voltage applied to the transmitting coil 14 being transferred to the receiving coil 18 as a function of the coupling coefficient between the two coils, which coupling coefficient is highly dependent upon the separation distance between the two coils and the medium separating the two coils (in this case, body flesh and air).

Figure 2:
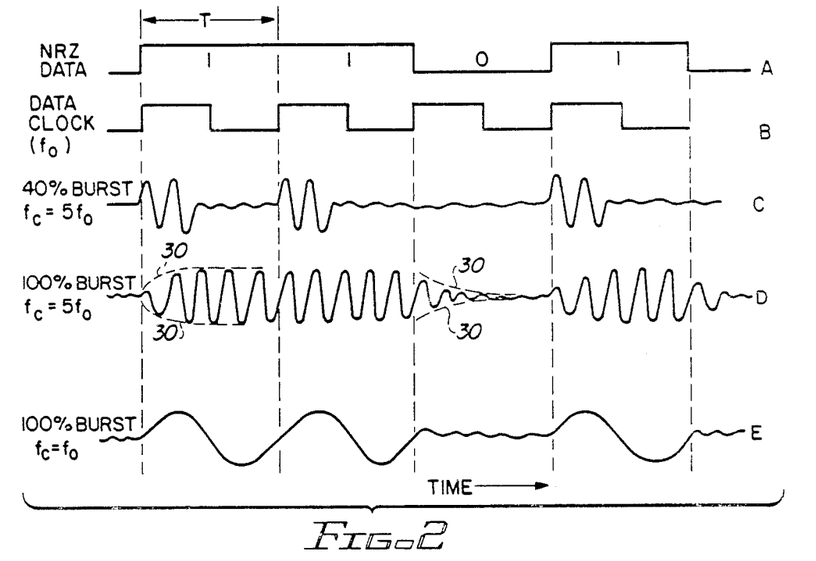
FIG. 2 is a waveform timing diagram that depicts representative signal waveforms that may be used with the burst mode transmitter of FIG. 1.

FIG. 2 illustrates representative waveforms that may be used with the operation of a burst mode transmitter, such as the device 12 of FIG. 1. These waveforms are presented to define the various parameters that are typically used in specifying the operation of a burst mode transmitter or oscillator, and to further illustrate some examples of these parameters. Line A of FIG. 2, for example, depicts digital NRZ (non return to zero) data having a bit period of T seconds. In accordance with the NRZ pattern shown, a digital "1" is represented as a high level, and a digital "0" is represented as a low level. Thus, the waveform shown on line A represents the digital data "1101". Line B illustrates a clock signal having a frequency $f_0=1/T$, i.e., the bit rate. Line C shows a representative voltage waveform to be transmitted (e.g., to be applied t the transmitting coil 14 of FIG. 1) assuming a burst duration of 40% of the bit period, and further assuming a carrier frequency of $5f_0$. Similarly, line D shows a representative voltage waveform to be transmitted assuming a burst duration of 100% of the bit period, and also assuming a carrier frequency of $5f_0$. In contrast, line E illustrates a representative voltage waveform assuming a burst duration of 100% of the bit period and a carrier frequency $f_c=f_O$. For a maximum transfer rate of data through a limited bandwidth system, it is generally preferred that the carrier frequency be the same as the bit rate, as shown in line E. However, for less than a 100% burst duration, and due to other limitations, such as explained in the next paragraph, this is not always possible.

The waveform of line D in FIG. 2 further illustrates the manner in which the voltage to be transmitted in a given burst exponentially increases up to its maximum value, or exponentially decreases from its maximum value, in accordance with a fixed time constant (the effects of this time constant being represented in FIG. 2, line D, by the dashed line envelope 30). That is, every time there is a change in the data to be transmitted, the voltage waveform appearing across the load of the transmitter—a tank circuit—does not change immediately. Rather, it changes gradually, following the time constant envelope, in accordance with well known transient circuit analysis principles. Unfortunately, the existence of this transient envelope in the signals to be transmitted exists in many prior art burst mode transmitters, and encumbers their efficient operation. This is because, as seen in FIG. 2, the transmitted signal is not transmitted at full power throughout the entire duration of the bit period when the carrier signal is to be transmitted; and the absence of a transmitted signal is not possible throughout the entire duration of the bit period when the carrier signal is not be transmitted. Thus, the desired information to be transmitted is not transmitted efficiently.

It should be further noted that while only line D in FIG. 2 illustrates this exponentially increasing/decreasing transient condition, it may also exist in connection with the waveforms of lines C and E. If present in line E, for example, to the same extent as shown in line D (i.e., if the time constant were approximately the same value), and if less than a 100% burst duration were used, it is evident that there would not be much of a signal left to be transmitted during the burst. For this and other reasons, it is quite common for burst mode transmitters and oscillators to transmit several cycles of the carrier frequency in each transmitted burst, even though such transmission may require a significantly wider bandwidth.

Figure 3:
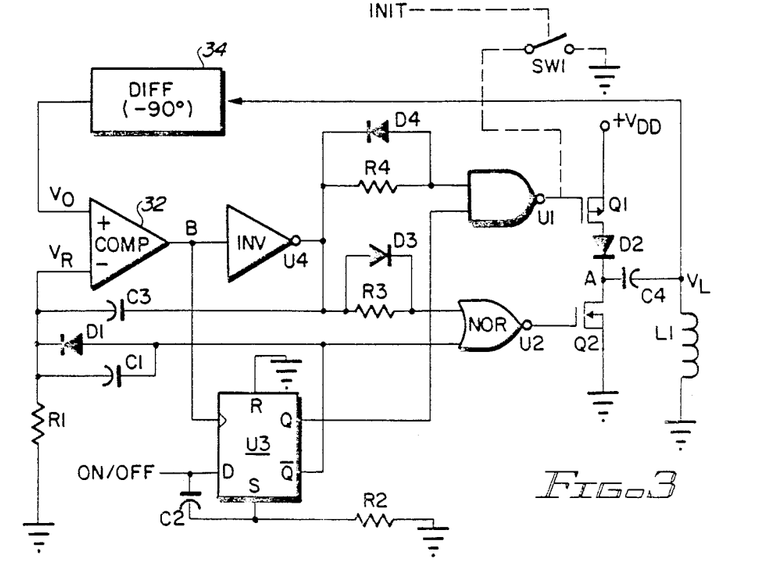
FIG. 3 is block/logic schematic diagram of a self oscillating burst mode transmitter made in accordance with the present invention.

Referring next to FIG. 3, a schematic/block diagram of the preferred embodiment of a self-oscillating burst mode transmitter made in accordance with the present invention is shown. At the heart of the transmitter is a tank circuit comprising an inductor L1 and a capacitor C4. The capacitor C4 is switchably connected in parallel with the inductor L1, which inductor L1 functions as the transmitting coil, by way of FET transistor switch Q1 or FET transistor switch Q2. One side of the inductor L1 is connected to ground and the other side is connected to one side of capacitor C4. The voltage of the tank circuit at the junction of the inductor L1 with the capacitor C1, measured relative to ground, is hereafter referred to as the core voltage, $V_L$.

Switch Q1 connects the side of capacitor C4 not connected to the inductor L1, labeled "A" in FIG. 3, to a positive voltage potential, $+V_{DD}$, through a diode D2. The cathode of diode D2 is connected to the "A" side of capacitor C4, and the anode of D2 is connected to one leg of the switch Q1. The other leg of switch Q1 is connected to the power supply $+V_{DD}$. Switch Q2 connects the "A" side of capacitor C4 to ground.

The operation of switches Q1 and Q2 is controlled by logic signals obtained from the outputs of the NAND gate U1 and NOR gate U2, respectively. One input to each of these gates U1 and U2 is obtained from flip flop U3, with the Q output of U3 being connected to NAND gate U1, and the Q* output or U3 (where Q* is the inverse of Q) being connected to NOR gate U2. As thus connected, and as will be explained more fully below in connection with the description of the waveform timing diagram of FIG. 5, the flip flop U3 thus enables one of the gates U1 or U2 and disables the other one. This means that only one of the switches Q1 or Q2 may be ON at any given time. Further, as will also be explained below in connection with the description of FIG. 5, while only one of the switches Q1 or Q2 may be ON at any given time, both switches may be OFF at the same time.

The other input to the gates U2 and U3 is connected to an inverter gate U4 through respective delay circuits. A first delay circuit is made up of a resistor R3 in parallel with a diode D3. A second delay circuit is made up of a resistor R4 in parallel with a diode D4. The first delay circuit is connected between the output of the inverter gate U4 and the input of NOR gate U2, with the cathode of diode D3 being connected to the NOR gate U2. The second delay circuit is connected between the output of the inverter gate U4 and the input of NAND gate U1, with the cathode of diode D4 being connected to the output of inverter U4. It is the function of these delay circuits to ensure that as the output of inverter gate U4 changes from one state to another, and assuming that both gates U1 and U2 are enabled by the correct state of flip flop U3, that there is a slight delay between the time when one of the gates U1 or U2 changes state, thereby turning OFF either switch Q1 or Q2, and the other of the gates U1 or U2 changes state, thereby turning ON the other switch Q1 or Q2. In other words, these delay circuits prevent switches Q1 and Q2 from being ON at the same time as one switches from ON to OFF, and the other switches from OFF to ON.

The input to the inverter gate U4, and the signal that controls the operation of the transmitter when it is enabled, is the output signal from a comparator circuit 32. The comparator circuit 32 compares two input signals, one designated $V_O$ connected to the non-inverting ("+") terminal, and the other designated $V_R$ connected to the inverting ("−") terminal, and produces an output signal, designated "B", that assumes one of two values. When the signal $V_O$ is greater than the signal $V_R$, the output signal "B" from the comparator 32 goes high.

When the signal $V_O$ is less than the signal $V_R$, the output signal "B" from the comparator circuit 32 goes low.

The "−" input terminal of the comparator circuit 32 is connected to ground (zero volts) through a resistor R1. Thus, the signal $V_R$ is normally a reference signal which assumes a value of zero volts. The "+" input terminal of the comparator circuit 32 is connected to the output of a phase shift network 34. The input to the phase shift network 34 is the load voltage $V_L$ appearing across the inductive transmitting coil L1 of the tank circuit. As indicated in FIG. 3, the preferred phase shift network 34 is a differentiator that shifts the phase of the load voltage $V_L$ by −90 degrees ($\pi/2$ radians). Hence, as the load voltage $V_L$ assumes a substantially sinusoidal waveform as the tank circuit resonates, the output voltage of the phase shift network 34 also assumes a substantially sinusoidal waveform that is shifted in phase relative to the load voltage $V_L$ by 90 degrees, or approximately ¼ of a cycle. Thus, the zero crossings of the load voltage $V_L$ correspond in time to the peaks of the phase shift circuit output voltage $V_O$, and the peaks of the load voltage $V_L$ correspond in time to the zero crossings of the voltage $V_O$. In the configuration thus described, the phase shift network 34 and the comparator circuit 32 accordingly function as a peak detection circuit for the load voltage $V_L$. That is, at the point in time when the load voltage $V_L$ is at a peak, the output voltage from the phase shift network 34 is crossing zero, meaning that it is just changing from being greater than or less than the zero volt reference signal $V_R$ applied to the "−" terminal of the comparator circuit. Hence, the output signal "B" of the comparator circuit is also changing from one state to another at this time. Therefore, a change in the output signal "B" indicates the occurrence of a peak in the load voltage $V_L$.

Still referring to FIG. 3, it is seen that three other signals or circuit elements are also connected to the "−" input terminal of the comparator circuit 32. A first is a capacitor C3. This capacitor C3 functions as a "speed-up" capacitor that speeds up the comparator and inverter transitions. The speed-up capacitor C3 is connected between the "−" terminal of the comparator circuit 32 and the output of inverter gate U4. As thus connected, it provides, in effect, a positive feedback connection to the comparator circuit that assures a quick, non-oscillatory transition of the comparator output signal "B" from one state to another. For example, if the output signal "B" of the comparator 32 is low, and if the "+" input signal to the comparator 32 starts to increase above zero, the output signal "B" will start to change from its low state to its high state. As it does so, the output of the inverter gate U4 (which is the inverse of the signal "B") also beings to change from its high state to its low state. This negative-going transition at the output of the gate U4 is coupled back to the "−" terminal of the comparator 32 through the capacitor C3, causing the difference between the signals at the "+" and "−" terminals to be further emphasized, thereby assuring that the output signal "B" of the comparator 32 continues to change from its low state to its high state. A similar response occurs when the comparator output "B" is changing from its high state to its low state.

The other circuit elements connected to the "−" terminal of the comparator 32 are a diode D1 and capacitor C1. The cathode of diode D1 is connected to the "−" terminal of the comparator 32. The anode of diode D1 is connected to the Q* output of flip flop U3. As the Q* output of flip flop U4 changes from a low to a high state (i.e., when flip flop U3 is reset), this positive going transition is transferred to the inverting terminal of the comparator 32, forcing the output "B" of the comparator to go low. The capacitor C1 is connected in parallel with diode D1. When flip flop U3 is set, causing a high to low transition in the Q* output, this transition is also coupled to the inverting terminal of the comparator 32, forcing its output "B" to go high.

As also seen in FIG. 3, the clock input of the flip flop U3 is connected to the "B" output of the comparator 32. Flip flop U3 is preferably a D-type flip flop, such as is obtained from ½ of a dual D flip flop CMOS 4013 device. Hence, the data D on its data input line is clocked to the Q output of the flip flop on the positive going transition of the clock signal. Thus, when the output "B" of the comparator goes from low to high, the Q output of flip flop U3 is set to the state of the input data D (and the Q* output of flip flop U3 is set to the inverse of the data D). The data D is connected to an ON/OFF control signal that enables or disables the transmitter. As will be evident from the description of FIG. 5 below, when it is desired to transmit a burst from the transmitter shown in FIG. 3, the ON/OFF control signal goes high, starting the burst. When it is desired to stop the burst, the ON/OFF signal goes low, and the burst stops at the occurrence of the next peak of a prescribed polarity of the load voltage $V_L$ after the ON/OFF control signal goes low. A capacitor C2 and a resistor R2 couple the ON/OFF control signal to the set terminal of the flip flop U3. As the ON/OFF signal switches from a low level (turn off burst) to a high level (turn on burst), the positive transition is coupled through C3 to the set terminal, thereby ensuring that flip flop U3 starts out in its set state (Q=high; Q*=low). Otherwise, the set terminal of flip flop U3 is held low through resistor R2, connected between the set terminal and ground. The reset terminal of flip flop U3 is also tied to ground. With both the set and reset terminals at a low level (ground), the flip flop functions as a normal D flip flop with its output signals being controlled by the value of the data D at the time of a positive clock transition.

Figure 4:
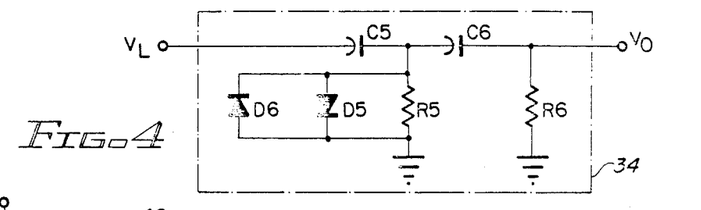
FIG. 4 is a schematic diagram of one type of phase shift circuit that could be used as part of the self oscillating burst mode transmitter of FIG. 3.

FIG. 4 shows a preferred circuit schematic diagram for the phase shift network 34. As seen in FIG. 4, this circuit comprises a differentiator circuit that comprises two capacitors C5 and C6 connected in series. At the common junction point between these two capacitors C5 and C6, a resistor R5 is shunted to ground. Clamping diodes D5 and D6 are connected in parallel across resistor R5, with the anode of one being connected to the cathode of the other. These diodes limit the magnitude of the signal that may pass through the network 34, and thereby protect the input circuits of the comparator 32 from excessive input signal levels. Another resistor R6 is shunted to ground from the other side of capacitor C6, i.e., the side not connected to the common junction point between C5 and C6. The load voltage, $V_L$, is applied to one side of capacitor C5. The phase shifted or differentiated output voltage, $V_L$, appears at the junction of capacitor C6 and resistor R6.

Referring next to the waveform timing diagram of FIG. 5, and also with reference to the circuit diagram of FIG. 3, the operation of the self-oscillating burst mode transmitter will be described. It is noted that the waveforms shown in FIG. 5 show the steady state operation of the circuit, after the circuit has been operating for one or more bursts. The transient start-up operation of the circuit is essentially the same as the steady state operation, once certain initial conditions are set. Initially, the noise on core L will be enough to trip the comparator 32 to one state, next to the opposite state, thus starting the oscillatory process.

At time $t_O$, and assuming an initial charge on C4, the ON/OFF control signal goes high. This sets flip flop U3, through capacitor C2 and resistor R2. With flip flop U3 set, its Q output goes high, enabling NAND gate U1, and its Q* output goes low, enabling NOR gate U2. Further, as the Q* output goes low, this negative-going transition is coupled to the inverting input of comparator 32, forcing the "B" output of comparator 32 to go high. With the "B" signal high, the output of inverter gate U4 is low. This low input is applied to both the NAND gate U1 and the NOR gate U2. The low input at NAND gate U1 provides a "1" at the output meaning that transistor switch Q1, which is a P-channel device, remains off. However, the low input at NOR gate U2 forces the output of the NOR gate to go high, and turns on transistor switch Q2, which is an N-channel device.

With switch Q2 on, point "A" of the circuit is connected to ground, forcing the voltage across coil L1 (as measured relative to ground) to go negative by an amount equal to the charge on capacitor C4. The voltage across the tank circuit, $V_L$, thus begins to move towards a positive peak value in accordance with conventional tank circuit operation. As it does so, the phase shift network 34 applies the signal $V_O$, shifted in phase by $-90$ degrees from the signal $V_L$, to the non-inverting input of the comparator 32. The inverting input of the comparator 32 is coupled to ground ($V_R$) through resistor R1. When $V_L$ reaches its positive peak, the comparator noninverting input goes through zero, and the comparator output signal "B" changes from its high state to its low state. This causes switch Q2 to turn OFF, and after a short delay causes switch Q1 to turn ON. With switch Q1 ON, point "A" of the circuit is connected to $+V_{DD}$. In turn, this action causes the load voltage, $V_L$, to initially jump by an amount equal to the charge on the capacitor C4 at the time switch Q1 turns ON, and then move towards a negative peak value in accordance with conventional tank circuit operation. When $V_L$ reaches its negative peak, the comparator noninverting input again goes through zero, and the comparator output signal "B" changes from its low state to its high state. This causes switch Q1 to turn OFF, and after a short delay, causes switch Q2 to turn ON. This action causes the load voltage, $V_L$, to jump by an amount equal to the charge on C4 at the time switch Q2 turns ON, and then again move towards a positive peak value in accordance with conventional tank circuit operation. In this manner, the tank circuit continues to self-oscillate at a rate determined by the resonant frequency of the tank circuit.

When the ON/OFF control signal goes low, which can occur at any time, nothing happens to change the operation described above until the load voltage $V_L$ reaches its negative peak. At that moment, the comparator output "B" goes high, the flip flop U3 resets, causing both the NAND gate U1 and the NOR gate U2 to be disabled, turning OFF both switches Q1 and Q2. Further, the transition of Q* of flip flop U3 from low to high (as U3 resets) is coupled through diode D1 to the inverting input of the comparator 32, turning the comparator output "B" low once again. Thus, the comparator output "B" goes high only for a very brief time. Once the switches Q1 and Q2 are both turned off, the voltage at point "A" in the circuit goes to a voltage equal to the peak AC voltage of the tank circuit, and remains at that value for a time determined by the leakage current of the diode D2 and the switch Q2. By using high quality devices for D2 and Q2, this time can be relatively long, e.g., several seconds.

Advantageously, the operation of the circuit as described above allows the burst voltage to always start and stop exactly at the peak voltage. This peak voltage may be considered as a maximum voltage, whether it is a negative peak voltage or a positive peak voltage. (A negative peak voltage is illustrated in FIG. 5.) Further, in between bursts, the energy of the tank circuit is saved or stored on capacitor C4, so that the next burst starts with the same prior peak (maximum) voltage amplitude.

The present invention requires a circuit to automatically control the number of cycles of the carrier signal which appear in each burst. A simple one-shot multivibrator (not shown), which starts with the oscillator and finishes in the middle of the last cycle, may be used. What is required is a control signal with a duration of $t=(n-\frac{1}{2})T\pm\frac{1}{2}T$, which does not need to be precise. Alternately, a circuit such as the one shown in FIG. 6 may be used to accomplish the same function. The voltage appearing at point "A" in the circuit of FIG. 3 is applied to the input of an inverting buffer amplifier 38, or equivalent. Because the voltage at point "A" includes some large peak to peak excursions, a coupling capacitor C7 and clamping diode D7 are used to limit the voltage swing at the input of the amplifier 38. The output of the amplifier 38 is then applied to the clock input of a count down register 40. This count down register includes a strobe or load terminal, "L", that loads data thereinto when the strobe signal goes low. The register further includes an output signal $Q_O$ that is high for so long as the register contents are non zero, and that goes low when the register contents are zero. A preselected number "n" is programmably stored in a memory device 42 and loaded into the register 40. The value of "n" is one less than the integral number of carrier cycles desired in the transmitter burst. As the register 40 counts down from the value "n" to zero, decrementing one number with each cycle of the "A" signal, the $Q_O$ output signal from the register is high. As soon as the register is zero, the $Q_O$ output signal goes low. This output signal is applied to an AND gate 44 where it is logically ANDED with a START signal. The output signal from the AND gate 44 may function as the ON/Off command signal described above. So long as the START signal is high, and the $Q_O$ signal is high, the ON/OFF command signal is also high. As soon as either the START signal or the $Q_O$ signal goes low, however, the ON/OFF signal goes low, causing the transmitter to stop the burst at the conclusion of the next cycle of the load voltage $V_L$. When the next burst is desired, typically at a time determined by a burst rate clock signal, the value "n" is again loaded into the count down register 40 and the process repeats. In this manner, the register is reloaded with the value "n" at the desired burst rate, causing each burst to have n+i cycles of the carrier signal therein.

Figure 6:
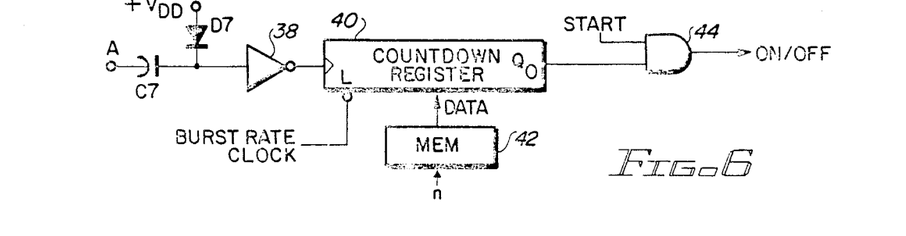
FIG. 6 is a block diagram depicting one manner in which the number of periods contained in each burst of the oscillator of FIG. 4 can be automatically controlled based on a programmed number of periods.

It is noted that the circuit components shown in FIGS. 3, 4 and 6 may be commercially available components available from numerous vendors at modest cost. The logic circuits, for example, are preferably from the CMOS 4000 series, available from, e.g., RCA. The diodes may be 1N914 diodes, available from, e.g., Motorola. The transistor switches may be 1RFU9022 (Q1)

and 1RFU110 (Q2). The comparator may be an LM393A. Equivalent components may, of course, also be used.

Further, it is noted that in the preferred application of the invention, involving the transmitting of bursts to an implantable medical device, the burst rate is approximately 8000 Hz, and one cycle of the carrier signal is included in each burst.

As described above, it is thus seen that the present invention provides a self-oscillating burst mode transmitter or oscillator that periodically transmits or generates bursts of a carrier signal at a prescribed rate wherein each burst includes an integral number of periods of the carrier signal. Further, the carrier signal starts and stops each burst at a peak value, and this peak value is advantageously stored and used as the starting voltage of the carrier signal at the commencement of the next burst. The transmitter thus provided is low in cost, efficient to operate, and reliable in performance. Further, in one embodiment, the number of integral cycles of the carrier signal included in each burst may be programmably selected. It is also apparent from the above description of the invention, that the invention also includes a method of generating or transmitting an integral number of cycles of a carrier signal within each burst of a burst mode oscillator or transmitter. In accordance with this method, the peaks of the carrier signal are detected, and are used to precisely control when a tank circuit, resonant at the carrier signal frequency, is connected or disconnected to the power source. When connected to the power source, the tank circuit resonates for an integral number of cycles, thereby providing an integral number of carrier signal cycles When disconnected from the power source, the tank circuit does not resonate, and no carrier signal is provided.

While the invention described herein has been described with reference to a particular embodiment and application thereof, numerous variations and modifications could be made thereto by those skilled in the art without departing from the spirit and scope of the invention as claimed.

What is claimed is:

1. A self-oscillating burst mode transmitter comprising:
    an L-C tank circuit, said L-C tank circuit including a transmitting coil connected to a capacitor;
    switch means responsive to a control signal for switchably connecting an energy source to said L-C tank circuit, whereby said L-C tank circuit oscillates at a resonant frequency, an oscillatory voltage waveform being developed across said transmitting coil and capacitor as said tank circuit oscillates;
    phase shift means coupled to said transmitting coil for generating an output voltage signal having the same frequency as said oscillatory voltage waveform, but having a phase angle that is shifted from the phase angle of said oscillatory voltage waveform by a prescribed amount;
    comparator means coupled to said phase shift means for comparing the amplitude of the output voltage signal generated by said phase shift means with a reference signal, and for generating thereby said control signal which changes in value as a function of whether the amplitude of said output voltage signal is less than or greater than said reference signal, whereby the value of said control signal changes upon the occurrence of a prescribed voltage value of the oscillatory waveform; and
    inhibiting means coupled to said comparator means, for selectively blocking the delivery of said control signal to said switch means at a time within a cycle of said oscillatory voltage waveform when the voltage appearing across said transmitting coil and capacitor is at the prescribed voltage value, the capacitor of said L-C tank circuit storing said prescribed voltage value until such time as said control signal is no longer inhibited;
    said tank circuit starting its next oscillatory cycle when not inhibited by said inhibiting means with the voltage waveform across the transmitter coil at said stored prescribed voltage value, and stopping its oscillatory cycle with the voltage waveform across the transmitter coil at a corresponding prescribed voltage value, an integral number of periods of said oscillating voltage waveform occurring between the time said oscillatory cycle starts and stops.

2. The burst mode transmitter as set forth in claim 1 wherein said switch means comprises a first transistor switch that selectively connects said L-C tank circuit to a first polarity of a power source in response to one state of said control signal, and a second transistor switch that selectively connects said L-C tank circuit to a second polarity of said power source in response to the other state of said control signal.

3. The burst mode transmitter as set forth in claim 2 wherein said phase shift means comprises a circuit that differentiates the oscillatory voltage waveform, thereby causing said output voltage waveform to assume a waveform representative of the derivative of the oscillatory voltage waveform, said output voltage waveform being shifted in phase relative to said oscillatory voltage waveform by approximately 90 degrees.

4. The burst mode transmitter as set forth in claim 3 wherein the reference signal against which the amplitude of the output voltage signal is compared comprises a zero volt reference signal, whereby said comparator means functions as a zero crossing detector of said output voltage signal, said zero crossings corresponding to peaks in said oscillatory voltage waveform.

5. The burst mode transmitter as set forth in claim 4 wherein said inhibiting means comprise first and second logic gates connected to control said first and second transistor switches, respectively, each of said logic gates having an enabling signal applied thereto generated by a flip flop, said logic gates and flip flop being configured so as to prevent said first and second transistor switches from being turned on at the same time, yet allowing said transistor switches to both be turned off at the same time.

6. The burst mode transmitter as set forth in claim 5 wherein said flip flop is clocked by said control signal generated by said comparator means, which clock signal changes levels coincident with the occurrence of a peak in said oscillatory voltage waveform, a transition from a first level to a second level of said control signal occurring in response to a positive peak in said oscillatory voltage waveform, and a transition from the second level to the first level of said control signal occurring in response to a negative peak in said oscillatory voltage waveform, said flip flop being configured to assume the state of a data input signal in synchrony with a prescribed transition of a clock signal applied thereto, an ON/OFF enabling signal being applied to said flip flop as said data input, said flip flop thereby assuming a first state in synchrony with the occurrence of a prescribed peak of said oscillatory voltage waveform when said ON/OFF enabling signal is at a high level, and assuming a second state in synchrony with the occurrence of said prescribed peak of said oscillatory voltage waveform when said ON/OFF enabling signal is at a low level, said first state of said flip flop causing said first and second logic gates to be enabled.

7. The burst mode transmitter as set forth in claim 6 wherein said flip flop is further configured to assume said first state immediately in response to said ON/OFF control signal changing to a high level, and said flip flop assumes said second state in synchrony with the occurrence of said prescribed peak of said oscillatory waveform only after said ON/OFF control signal changes to a low level.

8. A self-oscillating burst mode transmitter comprising:
   a tank circuit;
   switch means responsive to a control signal for switchably connecting an energy source to said tank circuit, whereby said tank circuit oscillates at a resonant frequency, an oscillatory signal being developed across said tank circuit as said tank circuit oscillates;
   peak detection means for generating said control signal as a function of when the peaks within said oscillatory signal occur; and
   inhibiting means for selectively inhibiting the delivery of said control signal to said switch means coincident with the occurrence of the peaks within said oscillatory signal, said tank circuit including means for storing the energy associated with the peak signal until such time as said control signal is no longer inhibited;
   said tank circuit starting its next oscillatory cycle when not inhibited by said inhibiting means at a peak signal corresponding to the energy previously stored in said tank circuit, and stopping its oscillatory cycle when the oscillatory signal across the tank circuit is at a corresponding peak value, an integral number of periods of said oscillating signal thereby occurring between the time said oscillatory cycle starts and stops.

9. The burst mode transmitter as set forth in claim 8 wherein said peak detection means comprises:
   a differentiator circuit for differentiating the oscillatory signal; and
   a zero crossing detector for sensing each zero crossing of the differentiated oscillatory signal and for generating said control signal as a function of said sensed zero crossings, said control signal including a transition from one level to another for each sensed zero crossing of the differentiated oscillatory signal.

10. The burst mode transmitter as set forth in claim 8 further including means for programmably setting the number of integral periods of said oscillating signal occurring between the time said oscillatory cycle starts and stops.

11. A burst mode integral period oscillator comprising:
   a tank circuit including a transmitting coil connected to a capacitor;
   switch means for delivering power to said tank circuit, said tank circuit oscillating at a resonant frequency in response to said delivered power, an oscillatory voltage waveform being developed across said transmitting coil and capacitor as said tank circuit oscillates;
   sensing means for sensing when said oscillatory voltage waveform is at a peak value; and
   inhibiting means synchronized with said sensing means for selectively stopping the delivery of said power to said tank circuit at a time when the oscillatory voltage waveform developed across said transmitting coil and capacitor is at a peak voltage value, the capacitor of said tank circuit storing this peak voltage value until said inhibiting means again allows power to be delivered to said tank circuit, at which time said tank circuit again begins to oscillate at said resonant frequency, the oscillatory voltage waveform beginning at said peak voltage value stored by said capacitor;
   said tank circuit thereby starting an oscillatory cycle as allowed by said inhibiting means at a time in an oscillatory cycle of said oscillatory voltage waveform when the voltage waveform across the transmitter coil is at a first peak value, and said tank circuit stopping said oscillatory cycle as controlled by said inhibiting means at a time in the oscillatory cycle when the voltage waveform across the transmitter coil is at a second peak value, an integral number of periods of said oscillating voltage waveform occurring between said first and second peak values.

12. The integral period oscillator as set forth in claim 11 wherein said sensing means comprises
   phase-shifting means for shifting the phase of said oscillatory waveform by a prescribed amount; and
   threshold means for sensing when the amplitude of the phase-shifted oscillatory waveform exceeds a prescribed threshold value.

13. The integral period oscillator as set forth in claim 12 wherein the prescribed amount by which the phase of said oscillatory waveform is shifted by said phase-shifting means comprises approximately 90 degrees, and further wherein said prescribed threshold value of said threshold means comprises approximately zero volts.

14. The integral period oscillator as set forth in claim 12 wherein said phase shifting means comprises a differentiator circuit that differentiates said oscillatory waveform.

15. The integral period oscillator as set forth in claim 11 further including means for programmably setting the number of integral periods of said oscillatory voltage waveform that occur between said first and second peak values.

16. A method of controlling a burst mode oscillator so that each burst contains an integral number of cycles, said oscillator including a tank circuit that generates an oscillatory waveform having a prescribed frequency upon being energized with power from an external power source, said method comprising:
   (a) energizing said tank circuit with said power when a first burst of oscillations is desired;
   (b) sensing when the oscillatory waveform associated with said energized tank circuit is at a peak value;
   (c) selectively inhibiting the delivery of power to said tank circuit at the conclusion of said first burst of oscillations at a point within a cycle of the oscillatory waveform when the oscillatory waveform sensed in step (b) is at a prescribed value;

(d) storing the energy associated with the prescribed value of the oscillatory waveform during the time when said tank circuit is inhibited; and
(e) starting the oscillatory waveform of said tank circuit, when next energized at the beginning of a second burst of oscillations, at the prescribed value stored within said tank circuit in step (d).

17. The method set forth in claim 16 wherein step (b) comprises shifting the phase of the oscillatory waveform by a prescribed amount and sensing when the amplitude of the resulting phase-shifted signal exceeds a prescribed threshold.

18. The method set forth in claim 17 wherein the step of shifting the phase of the oscillatory waveform by a prescribed amount comprises shifting the phase by approximately 90 degrees, and sensing when the amplitude of the resulting phase-shifted signal is greater than zero.

19. The method set forth in claim 16 wherein the prescribed value of the oscillatory waveform at which the delivery of power to said tank circuit is inhibited at the conclusion of said first burst of oscillations comprises a peak value.

20. The method set forth in claim 16 further including: counting the number of oscillations of said oscillatory waveform, determining if the counted oscillations equal a prescribed number of oscillations, and inhibiting the delivery of power to said tank circuit in accordance with step (c) only if the counted oscillations equals the prescribed number of oscillations.

* * * * *